US007813401B2

(12) United States Patent
    Scherer

(10) Patent No.: US 7,813,401 B2
(45) Date of Patent: Oct. 12, 2010

(54) ELECTRICALLY PUMPED LOW-THRESHOLD ULTRA-SMALL PHOTONIC CRYSTAL LASERS

(75) Inventor: Axel Scherer, Laguna Beach, CA (US)

(73) Assignee: California Institute of Technology, Pasadena, CA (US)

( * ) Notice: Subject to any disclaimer, the term of this patent is extended or adjusted under 35 U.S.C. 154(b) by 57 days.

(21) Appl. No.: 11/777,904

(22) Filed: Jul. 13, 2007

(65) Prior Publication Data
US 2008/0080579 A1    Apr. 3, 2008

Related U.S. Application Data

(60) Provisional application No. 60/830,750, filed on Jul. 13, 2006.

(51) Int. Cl.
    *H01S 5/00* (2006.01)
    *H01L 31/00* (2006.01)
(52) U.S. Cl. ................................. 372/45.011; 257/21
(58) Field of Classification Search ............. 372/43.01, 372/45.011; 257/21
    See application file for complete search history.

(56) References Cited

U.S. PATENT DOCUMENTS

| 6,597,721 | B1 * | 7/2003 | Hutchinson et al. | ........... 372/98 |
| 6,674,778 | B1 * | 1/2004 | Lin et al. | ................. 372/46.01 |
| 6,711,200 | B1 * | 3/2004 | Scherer et al. | ................. 372/64 |
| 7,181,120 | B2 * | 2/2007 | Sugitatsu et al. | ............ 385/131 |
| 7,659,536 | B2 * | 2/2010 | Krishna et al. | ................. 257/14 |
| 2005/0110992 | A1 | 5/2005 | Scherer et al. | |
| 2007/0030873 | A1 * | 2/2007 | Deng | ....................... 372/50.11 |

OTHER PUBLICATIONS

Yablonovitch, Eli, "OPN Talks with Eli Yablonovitch The Father of Photonic Crystals", Optics and Photonics News, Jul./Aug. 2007, pp. 14-15, US.
Russell, Philip, "Photonic Crystal Fiber: Finding the Holey Grail", Optics and Photonics News, Jul./Aug. 2007, pp. 26-31, US.
Hecht, Jeff, "The Breakthrough Birth of the Diode Laser", Optics and Photonics News, Jul./Aug. 2007, pp. 38-43, US.
Meier, C., et al., "Visible Resonant Modes in GaN-based Photonic Crystal Membrane Cavities", Applied Physics Letters, 88, 3, 2006, US.

(Continued)

*Primary Examiner*—Minsun Harvey
*Assistant Examiner*—Phillip Nguyen
(74) *Attorney, Agent, or Firm*—Millstein Zhang & Wu LLC; Joseph S. Milstein

(57) ABSTRACT

The invention is a photonic crystal laser including a photonic crystal slab laser cavity including InGaP/InGaAlP crystalline layers, the InGaP/InGaAlP crystalline layers having a relaxed strain at one or more etched surfaces and a higher strain at a plurality of quantum wells and at a distance from the one or more etched surfaces. The photonic crystal laser also includes electrical pads configured to receive an electrical signal the electrical pads attached to the photonic crystal slab laser cavity via an insulating layer, the photonic crystal laser configured to emit a laser light in response to the electrical signal. In another aspect, the invention features a photonic crystal detector including a photonic crystal slab cavity including InGaP/InGaAlP crystalline layers. In yet another aspect, the invention features a process to fabricate a photonic crystal laser cavity.

20 Claims, 13 Drawing Sheets

OTHER PUBLICATIONS

Wu, X., et al., "Ultraviolet Photonic Crystal Laser", Applied Physics Letters, 85, 17, pp. 3657-3659, 2004, US.

Akahane, Y., et al., "High-Q Photonic Nanocavity in a Two-Dimentional Photonic Crystal", Nature, 425, 6961, pp. 944-947, 2003, US.

Yoshie, T., et al., "Quantum Dot Photonic Crystal Lasers", Electronics Letters, 38, 17, pp. 967-968, 2002, US.

Campbell, M., et al., "Fabrication of Photonic Crystals for the Visible Spectrum by Holographic Lithography", Nature, 404, 6773, pp. 53-56, 2000, US.

Painter, O., et al., "Two-dimensional Photonic Band-gap Defect Mode Laser", Science, 284, 5421, pp. 1819-1821, 1999, US.

Davis et al., "Auger Recombination Rates in Compressively Strained in . . . ", IEEE Photonic Technology Letters, vol. 5, No. 2, Feb. 1993, pp. 120-122, US.

Kash, K., et al., "Strain-induced confinement of carriers to quantum wires and dots within an InGaAs-InP quantum well", Applied Physics Letters, 55, 7, pp. 681-683, 1989, US.

Kangude, Red Emitting Photonic Devices Using InGaP/InGaAlP Material System, MIT Thesis, May 2005, 58 pgs.

* cited by examiner

Fabrication Results from Electrically Pumped Lasers (a) After 1st lithography for p-contact by lift-off (b) After etching for PCs followed by 2nd lithography (c) completed structures Photoluminescence from cavities

ELECTRICALLY PUMPED LOW-THRESHOLD ULTRA-SMALL PHOTONIC CRYSTAL LASERS

CROSS-REFERENCE TO RELATED APPLICATIONS

This application claims priority to and the benefit of U.S. provisional patent application Ser. No. 60/830,750, filed Jul. 13, 2006, which application is incorporated herein by reference in its entirety.

STATEMENT REGARDING FEDERALLY FUNDED RESEARCH OR DEVELOPMENT

The U.S. Government has certain rights in this invention pursuant to Grant No. F49620-03-1-0418 awarded by the Air Force Office of Scientific Research (AFOSR).

FIELD OF THE INVENTION

The invention relates to lasers and detectors in general and particularly to a laser or detector that employs a photonic crystal laser cavity.

BACKGROUND OF THE INVENTION

A number of problems in photonic crystal laser cavities have been observed. These problems are related to the unique geometry of photonic crystal lasers, which require small features to be etched through active material to define mirrors and cavities lithographically. The small dimensions of the etched features leads to potentially large surface recombination losses. Moreover the same material that generates light in optical cavities also constitutes the etched regions that reflect the light, resulting in light re-absorption losses. Finally, these lasers are often fabricated within thin membranes with little thermal heat-sinking, and have been mainly demonstrated in materials with low bandgaps, and this leads to high Auger recombination losses. Nonetheless, photonic crystal cavities offer many advantages over more conventional cavities for achieving ultrasmall modal volumes while maintaining high quality factors. When combining such cavities with light emitting active materials, such as quantum wells ("QW") or quantum dots ("QD"), it is possible to define ultra-small lasers. Such lasers are particularly interesting for applications in optical data communication. Past research on photonic crystal lasers has focused on near-IR wavelength emission using InGaAsP or InGaAs active materials.

In "Two-dimensional photonic band-gap defect mode laser," Science 284 (5421), 1819-1821 (1999), O. Painter, Jr. K. Lee; A. Sceherer et al. described a laser cavity formed from a single defect in a two-dimensional photonic crystal. The optical microcavity consisted of a half wavelength-thick waveguide for vertical confinement and a two-dimensional photonic crystal mirror for lateral localization. A defect in the photonic crystal was introduced to trap photons inside a volume of 2.5 cubic half-wavelengths, approximately 0.03 cubic micrometers. The laser was fabricated in the indium gallium arsenic phosphide material system, and optical gain was provided by strained quantum wells designed for a peak emission wavelength of 1.55 micrometers at room temperature. Pulsed lasing action was observed at a wavelength of 1.5 micrometers from optically pumped devices with a substrate temperature of 143 Kelvin.

In "Quantum dot photonic crystal lasers," Electronics Letters, 38 (17), pp. 967-968, (2002) T. Yoshie, O. B. Shchekin, H. Chen, D. Deppe, and A. Scherer described coupled cavity designs on two-dimensional square lattice photonic crystal slabs that were used to demonstrate optically pumped indium arsenide quantum dot photonic crystal lasers at room temperature. Threshold pump powers of 120 and 370 µW were observed for coupled cavities including two and four defect cavities defined in optimized photonic crystals.

Other groups have explored devices capable of emitting visible light. For example, in "Fabrication of photonic crystals for the visible spectrum by holographic lithography", Nature 404 (6773), 53-56 (2000), M. Campbell, D. N. Sharp, M. T. Harrison et al. described a technique of three dimensional holographic lithography well suited to the production of three-dimensional structures with sub-micrometer periodicity. In "Ultraviolet photonic crystal laser," Applied Physics Letters 85 (17), 3657-3659 (2004), X. Wu, A. Yamilov, X. Liu et al. described two-dimensional photonic crystal structures in zinc oxide films with focused-ion-beam etching. Lasing was realized in the near-ultraviolet frequency at room temperature under optical pumping. In "Visible resonant modes in GaN-based photonic crystal membrane cavities," Applied Physics Letters 88 (3), (2006), C. Meier, K. Hennessy, E. D. Haberer et al. demonstrated fabrication of fully undercut GaN photonic crystal membranes containing an InGaN multi-quantum well layer. It has remained difficult to obtain small mode volume lasers in visible light emitting materials systems, due to high surface carrier recombination velocities or the lack of high refractive index contrast substrates for light confinement in the vertical direction.

There is a need for efficient visible light emitting lasers and detectors.

SUMMARY OF THE INVENTION

The invention generally relates to laser and detector devices that can comprise a photonic crystal. Using a laser as an example, the light emitting material in the laser is deliberately grown to experience a large strain. As the laser is microfabricated, this strain is relaxed on the newly etched surfaces, resulting in a large strain gradient between the unpatterned regions and the etched regions. This strain gradient gives rise to changes in the bandgap of the semiconductor quantum wells, and can be used for preventing electrons and holes from reaching the surface and avoiding surface recombination losses, rendering the quantum well material close to the etched surfaces to have a higher bandgap than the material a longer distance away from the surfaces and becoming transparent and avoiding reabsorption losses in photonic crystal laser geometries, or rendering the quantum well material close to the etched surfaces to have a lower bandgap than the material a longer distance away from the surfaces, making the region further from the surface transparent and avoiding reabsorption losses in whispering gallery mode laser geometries. All convenient methods that create surfaces permitting such strain relaxation are contemplated, including photolithography and etching, and such techniques as crystal removal using energy supplied in a "direct write" mode for example using light, charged particles, active chemical species, or similar methods.

In one aspect, the invention features a photonic crystal laser. The photonic crystal laser comprises a photonic crystal slab laser cavity comprises crystalline layers in which an internal strain of at least one of a plurality of quantum wells is relaxed at one or more surfaces, retaining a higher strain at a plurality of quantum wells at a distance from the one or more etched surfaces; a photonic crystal mirror situated adjacent to the photonic crystal slab laser cavity; and electrical pads configured to receive an electrical signal, the electrical pads attached to the photonic crystal slab laser cavity via an insulating layer, the photonic crystal laser configured to emit a laser light in response to the electrical signal.

In one embodiment, the photonic crystal slab laser cavity comprises InGaP/InGaAlP. In one embodiment, one or more surfaces comprise at least one etched surface. In one embodiment, the photonic crystal laser is configured to emit laser light in the visible spectrum. In one embodiment, the photonic crystal laser is configured to emit laser light in a range of wavelength of between 500 nm and 700 nm. In one embodiment the photonic crystal laser is configured to detect light in a range of wavelength of about 650 nm to 690 nm. In one embodiment, the insulating layer comprises AlGaAs. In one embodiment, the electrical pads comprise a lateral contact geometry.

In one embodiment, there are present a plurality of photonic crystal lasers. The plurality of photonic crystal lasers are situated on a common substrate and configured as a multi-wavelength emitter array by lithographic tuning, wherein at least one of the plurality of photonic crystal lasers emits laser light at a first wavelength and at least another one of the plurality of photonic crystal lasers emits a laser light at a second wavelength, and the first and the second wavelengths are set during fabrication of the plurality of photonic crystal lasers. In one embodiment, the photonic crystal lasers are configured to be used in a wavelength division multiplexed system. In one embodiment, the photonic crystal lasers are configured as ultrasmall lasers to be used in biological or chemical detection within small sample volumes. In one embodiment, the photonic crystal lasers are configured as ultrasmall lasers to be used in spectroscopy applications.

In another aspect, the invention relates to a photonic crystal detector. The photonic crystal detector comprises a photonic crystal slab cavity comprising InGaP/InGaAlP crystalline layers, the InGaP/InGaAlP crystalline layers having a relaxed strain at one or more etched surfaces and a higher strain at a plurality of quantum wells and at a distance from the one or more etched surfaces; a photonic crystal mirror situated adjacent to the photonic crystal slab cavity; and electrical pads configured to generate an electrical signal in response to light incident on the photonic crystal detector, the electrical signal indicative of a property of the light incident on the photonic crystal detector.

In one embodiment the photonic crystal detector is configured to detect light in the visible spectrum. In one embodiment the photonic crystal detector is configured to detect light in a range of wavelength of about 500 nm to 700 nm. In one embodiment the photonic crystal detector is configured to detect light in a range of wavelength of about 650 nm to 690 nm.

In one embodiment, there are present a plurality of photonic crystal detectors. The plurality of photonic crystal detectors situated on a common substrate and configured as a multi-wavelength detector array by lithographic tuning, wherein at least one of the plurality of photonic crystal detectors detects light at a first wavelength and at least another one of the plurality of photonic crystal detectors detects light at a second wavelength, and the first and the second wavelengths are set during fabrication of the plurality of photonic crystal detectors. In one embodiment the photonic crystal detectors are configured to be used in a wavelength division multiplexed system. In one embodiment the photonic crystal detectors are configured as ultrasmall detectors to be used in biological or chemical detection within small sample volumes.

In one embodiment the photonic crystal detectors are configured as ultrasmall detectors to be used in spectroscopy applications.

In yet another aspect, the invention features a process to fabricate a photonic crystal laser cavity. The process comprises the steps of providing a substrate; forming a sacrificial layer on the substrate; growing a photonic slab layer on the sacrificial layer, the photonic slab comprises a plurality of quantum wells; defining within the photonic slab layer at least one electro-optical laser region, the at least one electro-optical laser region comprises a photonic crystal laser cavity; removing at least a portion of the sacrificial layer to provide a support for each of the at least one electro-optical laser region; and providing electrical contacts in electrical communication with each of the at least one electro-optical laser region, the electrical contacts configured to allow an electrical signal to be applied to the at least one electro-optical laser region.

In one embodiment the step of defining within the photonic slab layer comprises defining within the photonic slab layer at least one electro-optical laser region though electron beam lithography, the at least one electro-optical laser region comprises a photonic crystal laser cavity. In one embodiment the step of growing a photonic slab layer comprises growing a photonic slab layer by metal organic chemical vapor deposition on the sacrificial layer, the photonic slab comprises a plurality of quantum wells. In one embodiment the step of growing a photonic slab layer comprises growing a photonic slab layer comprises InGaP on the sacrificial layer, the photonic slab comprises a plurality of quantum wells. In one embodiment the step of growing a photonic slab layer comprises growing a photonic slab layer exhibiting an Auger recombination of less than $1\times10^{-30}$ cm$^6$ seconds$^{-1}$ on the sacrificial layer, the photonic slab comprises a plurality of quantum wells. In one embodiment the step of growing a photonic slab layer comprises growing a photonic slab layer on the sacrificial layer, the photonic slab comprises a plurality of quantum wells, the plurality of quantum wells placed near the center of the photonic slab by epitaxial growth. In one embodiment the step of defining within the photonic slab layer comprises defining within the photonic slab layer for the purpose of tuning an operating wavelength of the photonic crystal laser cavity at least one electro-optical laser region, the at least one electro-optical laser region comprises a photonic crystal laser cavity.

In still a further aspect, the invention relates to a laser microfabricated in a membrane of a material having a first electronic bandgap comprises strained quantum wells, the membrane having defined therein at least one laser cavity, the strained quantum wells configured to exhibit a modified electronic bandgap as compared to the first electronic bandgap as a consequence of strain relaxation in at least a portion of the material.

In another aspect, the invention relates to a detector microfabricated in a membrane of a material having a first electronic bandgap comprising strained quantum wells, the membrane having defined therein at least one laser cavity, the strained quantum wells configured to exhibit a modified electronic bandgap as compared to the first electronic bandgap as a consequence of strain relaxation in at least a portion of the material.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION OF THE INVENTION

Figure 1:
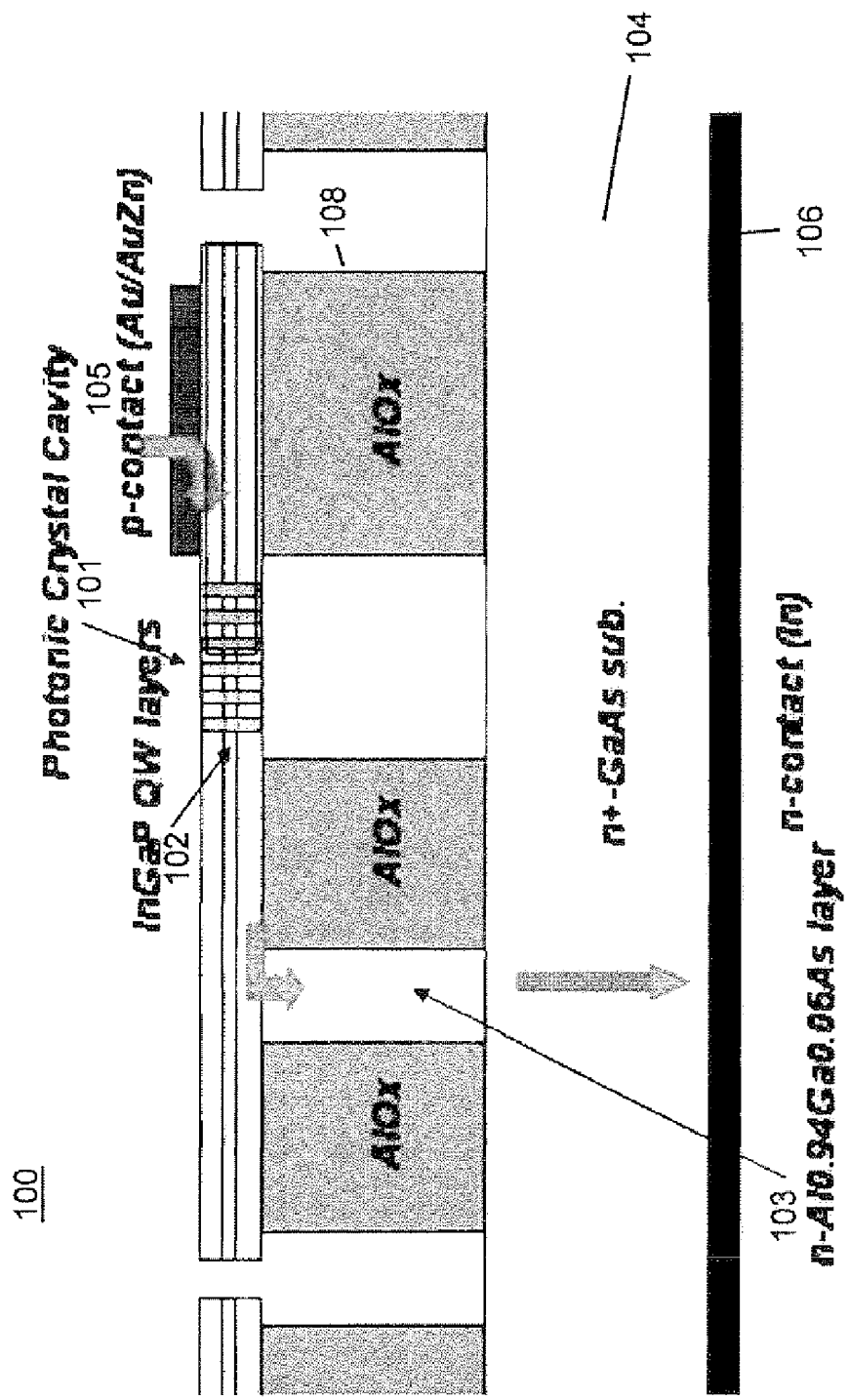
FIG. 1 illustrates an exemplary embodiment of an electrically pumped photonic crystal laser according to the invention.
Figure 3:
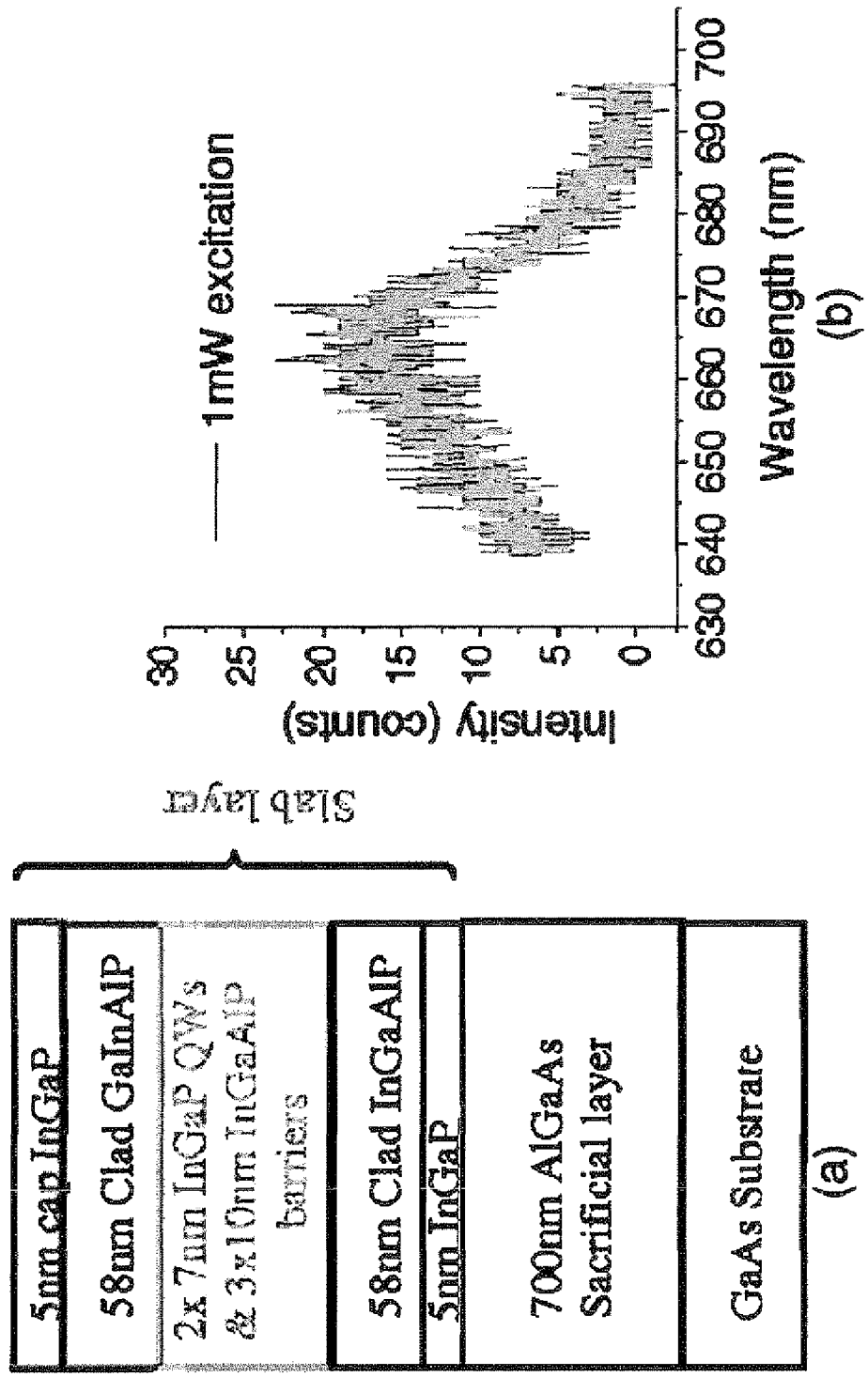
FIG. 3 shows (a) a block diagram of a layer sequence and (b) a corresponding graph of a typical photoluminescence emission spectrum of a grown water.

Our photonic crystal laser design addresses traditional problems that have been encountered in photonic crystal lasers emitting at longer wavelengths by (a) avoiding Auger recombination through the use of high-bandgap light emitting quantum wells, (b) avoiding surface recombination through the use of strain confinement of carriers to within the laser cavity and (c) avoiding re-absorption of light by deliberately engineering differences in strain into the quantum wells within the cavity compared to the photonic crystal mirrors surrounding the cavity. FIG. 1 is a cross sectional diagram that shows one exemplary embodiment of a photonic crystal laser 100 according to the invention. The embodiment of FIG. 1 is an illustrative electrically pumped photonic crystal design where a laterally defined p-n junction excites quantum well emission in the photonic crystal, Photonic crystal cavity 101 includes InGaP QW layers 102. Photonic crystal cavity 101 can be supported by one or more aluminum oxide (AlO$_x$) structures 108 within an AlGaAs layer 103. AlGaAs layer 103 can reside on a GaAs substrate 104. Electrical pumping can be accomplished via a p-contact 105, which can be fabricated as layers of gold and gold-zinc alloy (Au/Au/n) and an n-contact 106 which can be fabricated with indium (In). Contact diffusion conditions can be optimized to enable efficient carrier delivery to the active photonic crystal cavity. The shaded region at the right end of FIG. 1 adjacent the metal contact is intended to represent heavily doped crystalline material for making good contacts to the crystalline material. The term "slab" or "slab membrane" is intended to describe the crystalline material comprising the cap layers, cladding layers and active layers as indicated in FIG. 3(a) and FIG. 4(a), which slab layer can be supported so as to provide optical confinement, for example by being supported as a layer in free space or air, or as a layer adjacent a material having a lower optical index. Photonic bandgap materials are well known to those of ordinary skill in the related arts, and have been described in numerous publications since they were first theoretically described by Yablonovitch in the late 1980s.

Figure 2:
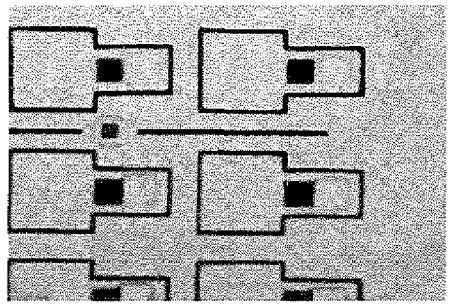
FIG. 2 illustrates an exemplary embodiment of lateral contact geometry according to the invention.
Figure 2:
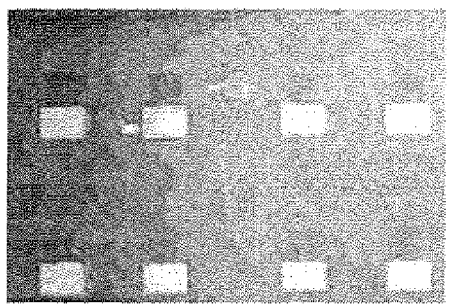
Figure 2:
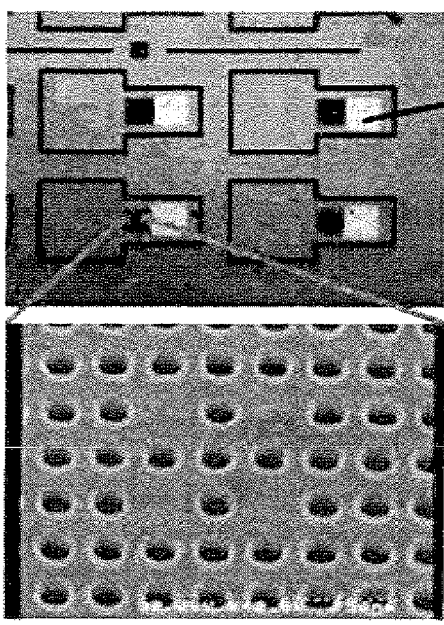
Figure 2:
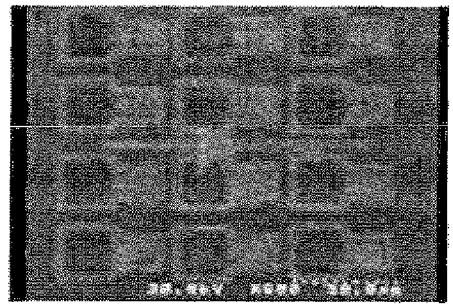

For the electrical contacting scheme, in the exemplary device geometries proposed here, we define lateral p-n junctions, which supply electrons and holes to the cavity region 101. Aluminum oxide adjacent to the bond pads can provide isolation. FIG. 2 shows one exemplary sequence of devices as they are subjected to various fabrication steps including (a) after lithography for p-contact liftoff, (b) after etching for photonic crystals followed by a $2^{nd}$ lithography, and (c) completed structures including a view of photoluminescence from cavities, Photonic crystal cavities 101 can be integrated into dense arrays in which each laser cavity of the array, supports only very few optical modes. Such photonic crystal lasers can be lithographically tunable to form compact multi-wavelength emitter arrays within a wavelength range from 660 to 690 nm.

ELECTRICAL PUMPING: Electrical pumping of photonic crystal lasers has proven to be very challenging. Only the group of Y. H. Lee et al. at KAIST, Korea, has been able to demonstrate electrically pumped photonic crystal lasers with very short lifetimes. Little additional work has emerged since this first demonstration in 2003 using InGasP/InP laser structures similar to the first devices explored for optical pumping. The difficulty of fabricating electrically pumped devices has been attributed to high Auger and surface recombination losses, as well as cavity heating problems in narrow-bandgap semiconductors such as InGaAsP, but is mainly a result of the very large re-absorption losses of laser light within the mirrors. As the mirrors of typical photonic crystal lasers are made from the same material as the cavity, the photonic crystal laser can be viewed as a laser cavity surrounded by a saturable absorber. This problem is typically only a nuisance when optically pumping the lasers, as the illumination spot has to be slightly defocused for lasing to be observed. However, in electrically pumped lasers, where carriers are generated in the high-finesse optical-cavity, these losses represent a tremendous increase in the threshold current. As increased threshold leads to cavity heating and subsequent Auger loss increases, it has proven to be extremely difficult to fabricate electrically pumped lasers in this geometry. Using our new strain-confinement designs, very compact low-threshold laser arrays can be fabricated lithographically.

FABRICATION: Photonic crystal slab structures can be grown by metal organic chemical vapor deposition (MOCVD) of InGaP/InGaAlP quantum well material on top of sacrificial AlGaAs layers supported by GaAs substrates. FIG. 3(a) is an exemplary structure shown in block diagram of a layer sequence, Optical gain was provided by two 7 nm thick and compressively strained InGaP quantum wells which were separated by 10 nm thick InGaAlP barrier layers. The quantum well active material was placed in the center of a 170 nm thick InGaAlP slab having 5 nm thick InGaP cap layers that provide protection for the GaInAlP layers during oxidation (e.g., to prevent oxidation of aluminum). A 700 nm thick sacrificial AlGaAs layer is provided between the slab and the GaAs substrate. The sacrificial layer provides material whereby the active laser cavities are held separated from the GaAs substrate. The exemplary active quaternary material was designed to emit light at around 670 nm. Light was strongly coupled into transverse electric modes by the compressively strained quantum wells.

FIG. 4(c) illustrates an exemplary sequence of processing steps that can be used to fabricate slab lasers supported on AlGaAs posts, with the structure shown in cross section. The epitaxially grown material that was fabricated into lasers was coated with a 100 nm SiON hard mask and 200 nm of Zep520 electron beam resist. Electron beam lithography was then used to define the photonic crystal cavity pattern within the Zep520 resist. Reactive ion etching ("RIE") was subsequently used to transfer the pattern from that resist into the SiON etch mask by using a $CHF_3$ plasma. After removal of the resist, the hard mask pattern was further transferred through the active layer with an iodine-based inductively coupled plasma RIE. Time controlled oxidation of the AlGaAs by water vapor followed by the potassium hydroxide (KOH) chemical dissolution of the aluminum oxide to form suspended slab membranes, as shown in the next to last image in FIG. 4(c) and in FIG. 5. Finally, diluted buffered hydrofluoric acid was used to remove the SiON etch mask.

Figure 4:
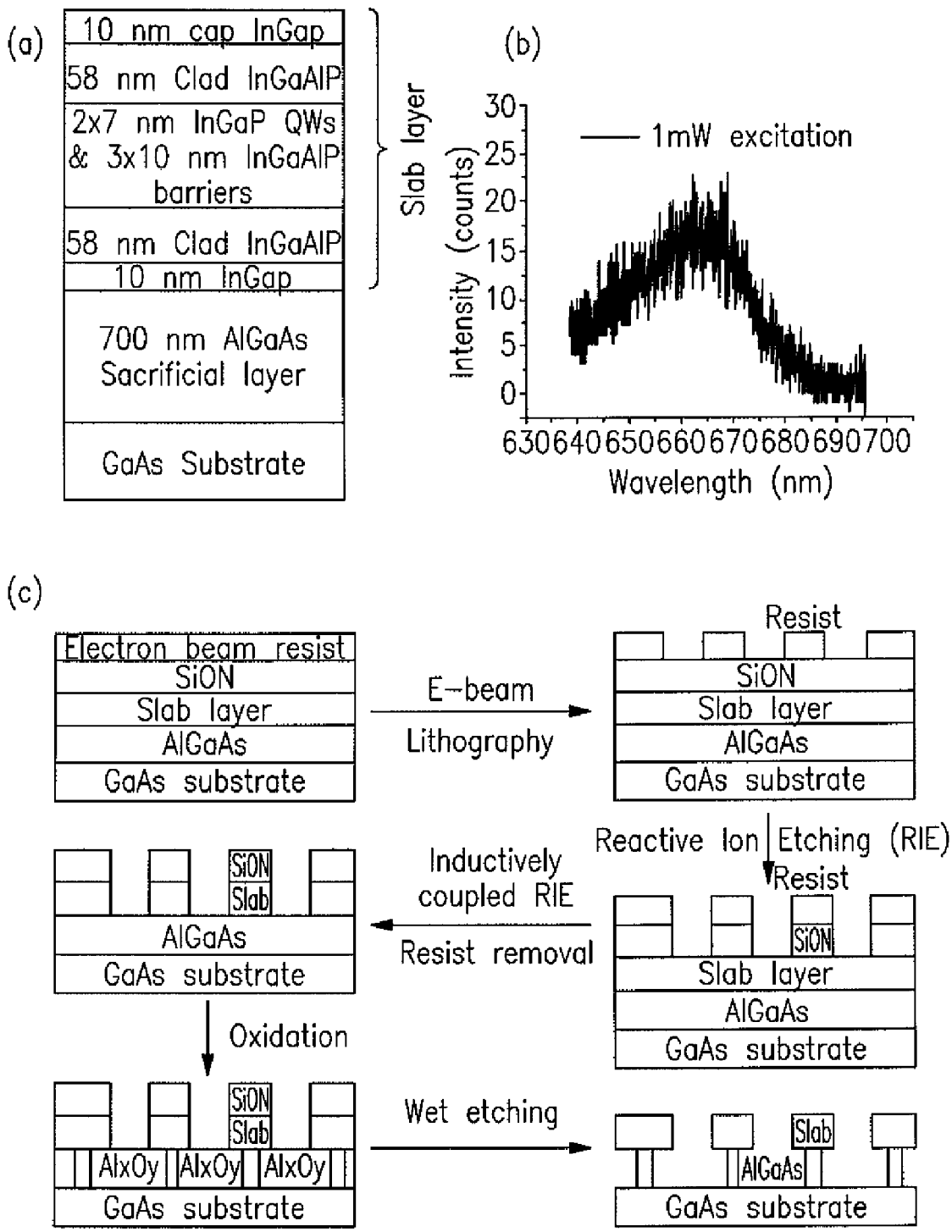
FIG. 4 shows (a) a block diagram of a layer sequence, (b) a graph of a typical photoluminescence emission spectrum of a grown wafer, and (c) a process procedure flow chart, not to scale.
Figure 5:
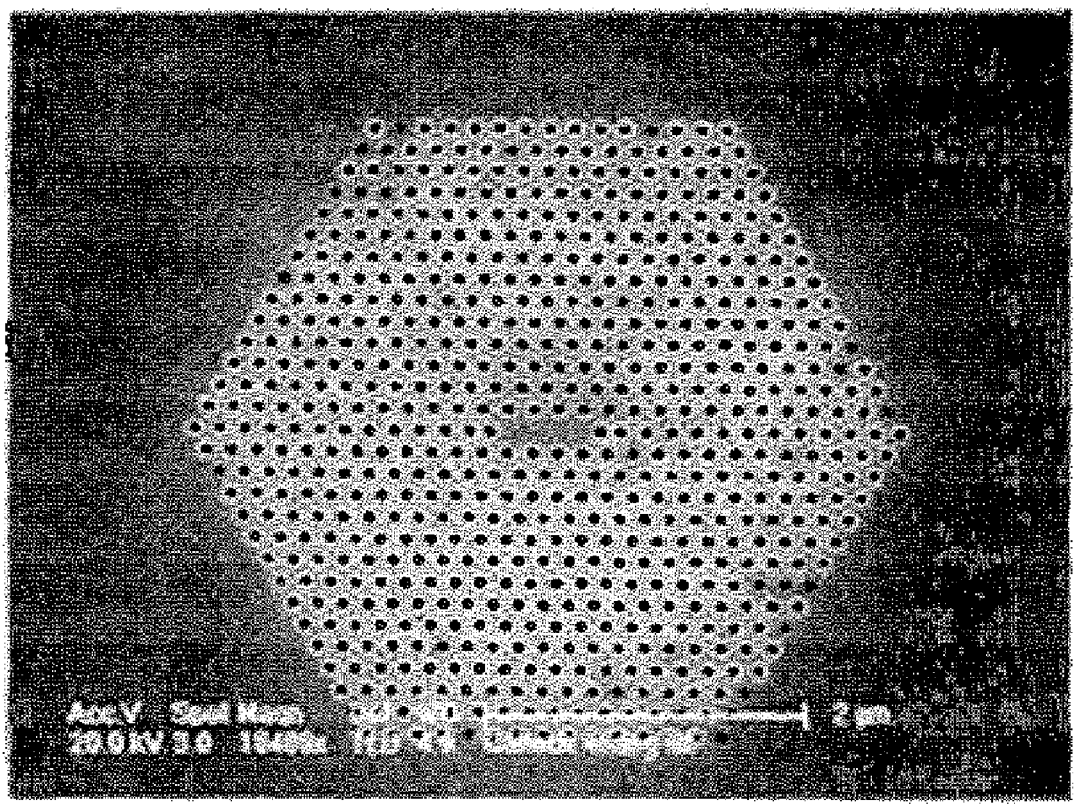
FIG. 5 shows a scanning electron microscopy micrograph of a photonic crystal laser cavity defined in InGaP after complete undercutting and AlGaAs removal.

Now, with reference to FIG. 4, the fabrication process is explained in somewhat more detail for another embodiment. InGaP/InGaAlP quantum wells were grown by metalorganic chemical-vapor deposition on top of a sacrificial AlGaAs layer, deposited onto a GaAs substrate. Optical gain was provided by two 7 nm thick and compressively strained InGaP quantum wells that were separated by 10 nm InGaAlP barriers (FIG. 4 (a)). As before, the active quaternary material was designed to emit light at ~670 nm (FIG. 4 (b)). Due to the compressively strained quantum wells, light was strongly coupled into transverse electric modes. The quantum well active material was placed within the center of a 170 nm InGaAlP slab, and 10 nm InGaP lattice matched layers were used on the top and bottom sides of the slab to protect the oxidation of aluminum in the quaternary compound. A 700 nm thick: sacrificial AlGaAs layer was introduced between the slab and the GaAs substrate, designed to be removed through a selective chemical etch to avoid coupling losses from the disk wings into the substrate. Following epitaxial growth of the InGaP/InGaAlP material, the wafers were coated with a 100 nm SiON hard mask and 200 nm ZEP520 electron beam resist.

Electron beam lithography was then used to define ring patterns within the ZEP520 electron beam resist (FIG. 4 (c)). The inner circles defined the disk diameters and the widths of the rings were designed to prevent optical coupling losses from the disk edge into the surrounding quantum well material. Reactive ion etching was subsequently used to directionally transfer the lithographic pattern from that resist into the SiON etch mask by using a $CHF_3$ plasma. After removal of the resist, the hard mask pattern was further transferred through the InGaP active layer with an iodine based inductively coupled plasma RIE. Time controlled steam oxidation of the AlGaAs by water vapor within a tube furnace followed by the KOH chemical dissolution of the resulting aluminum oxide formed the mushroom shaped microdisk structure shown in FIG. 12. Dilute buffered HF was finally used to remove the SiON etch mask. As an alternative to electron beam lithography, it should also be possible to define the microdisk laser disks by photolithography, which provides the opportunity of high throughput production of ultrasmall lasers. By defining a post radius to 0.2 μm smaller than that of the microdisk, we minimized the light leakage through the post while maintaining acceptable heat sinking of the active laser mode volume. We have fabricated and characterized many different sizes of disks, with diameters ranging from 1.6 μm down to 0.5 μm, by deliberately decreasing the diameter in 100 nm steps. In these laser arrays, we observe lasing in all of the disks except for the 0.5 μm diameter devices (that is, disks of 600 nm to 1600 nm in 100 nm steps).

In the case of electrically pumped photonic crystal lasers, electrical isolation can be provided, for example, by use of an AlGaAs layer underneath the active device region, as can be oxidized by a steam oxidation process and subsequently removed by selective etching directly underneath the photonic crystal regions while still offering support in the unperforated regions underneath the electrical contacts. In one exemplary electrical contact fabrication process, procedures include a first lithography to make a p-contact such as illustrated in FIG. 1 (e.g., applying a suitable resist, exposing the resist, and treating the resist to provide one or more open contact regions), metal deposition to form the p-type contact followed by lift-off to remove excess metal, a second lithography to define photonic crystals with electrical isolation, generating the photonic crystals by Chemically Assisted Ion Beam Etching (CAIBE), performing oxidation and wet-etching to remove at least a portion of a sacrificial layer such as GaAs, and performing a final oxidation. An n-type contact can be applied to the substrate so that an electrical signal can be applied to one or more of the photonic crystal lasers to electrically pump the one or more lasers as may be desired or useful.

Another embodiment is now described. Suspended photonic crystal slab cavities were optically pumped at room temperature using 5 ns pulses at 10 kHz (0.005% duty cycle) with a 408 nm InGaN semiconductor diode laser. The pump beam was focused onto the sample surface with a 50× objective lens to form an excitation beam spot size about 2 μm in diameter. The excitation power was determined by dividing the averaged pulse power by the duty cycle. The emission from the lasers was then collected through the same lens and their spectra detected with a liquid nitrogen cooled charge coupled device ("CCD") (for example, a Spec 10 camera, manufactured by Princeton Instruments Inc. of Acton, Mass.) and a detector filtered by a monochromator (for example, a Princeton Instruments SpectraPro). The monochromator entrance slit width was set to 10 μm and the 1200 groove/mm grating was used, resulting in a spectral resolution of approximately 0.1 nm. An additional flip-up mirror was used to guide the light into a CCD imaging system to view the near-field images of the lasers as well as the excitation laser spot. The imaging optics also permitted the observation of laser cavity modes.

Figure 6:
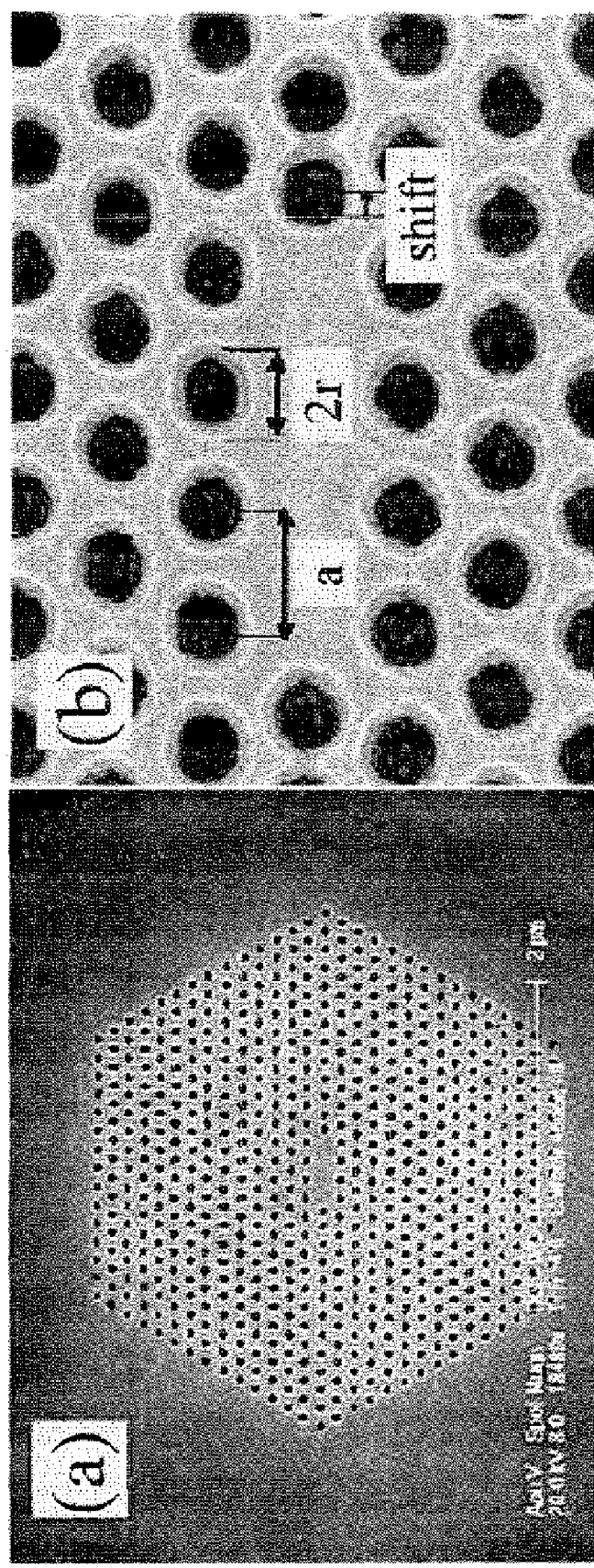
FIG. 6 shows scanning electron microscopy micrographs of a photonic crystal laser cavity at (a) low magnification showing an entire device, and (b) higher resolution showing the details of the cavity.
Figure 7:
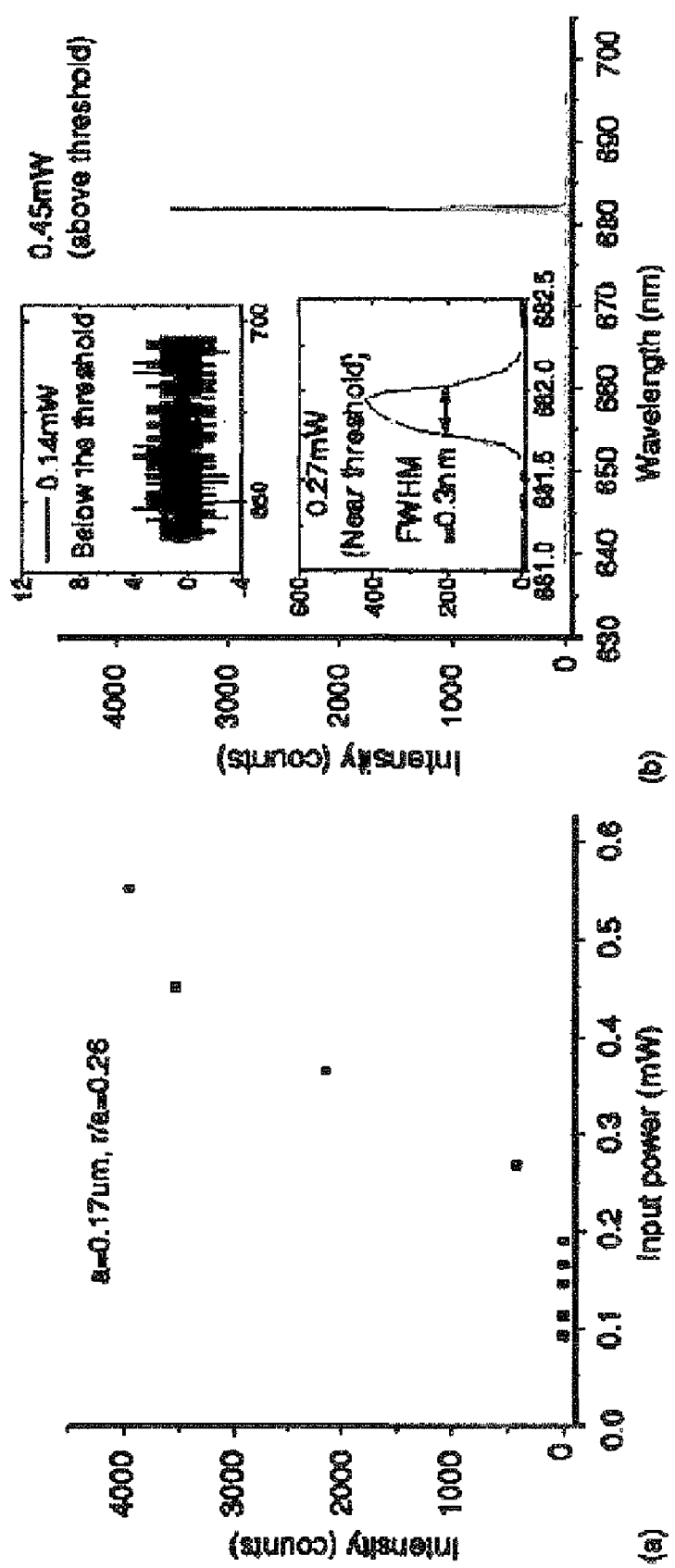
FIG. 7 shows a graph of a L-L curve and a corresponding graph of a typical lasing spectrum of an InGaP 2D photonic crystal laser with a lattice parameter of a=0.17 μm and a porosity factor of r/a=0.26.
Figure 8:
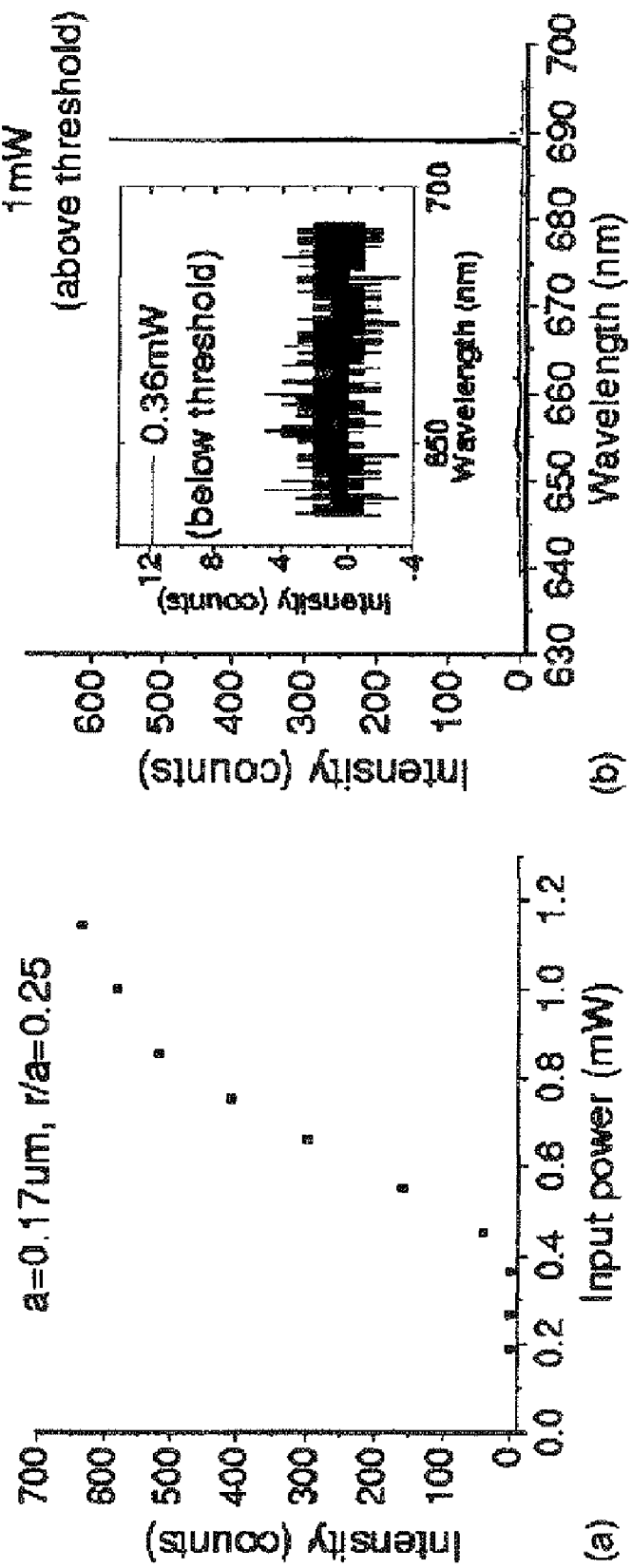
FIG. 8 shows a graph of a L-L curve and a corresponding graph of a typical lasing spectrum of an InGaP 2D photonic crystal laser with a lattice parameter of a=0.17 μm and a porosity factor of r/a=0.25.
Figure 9:
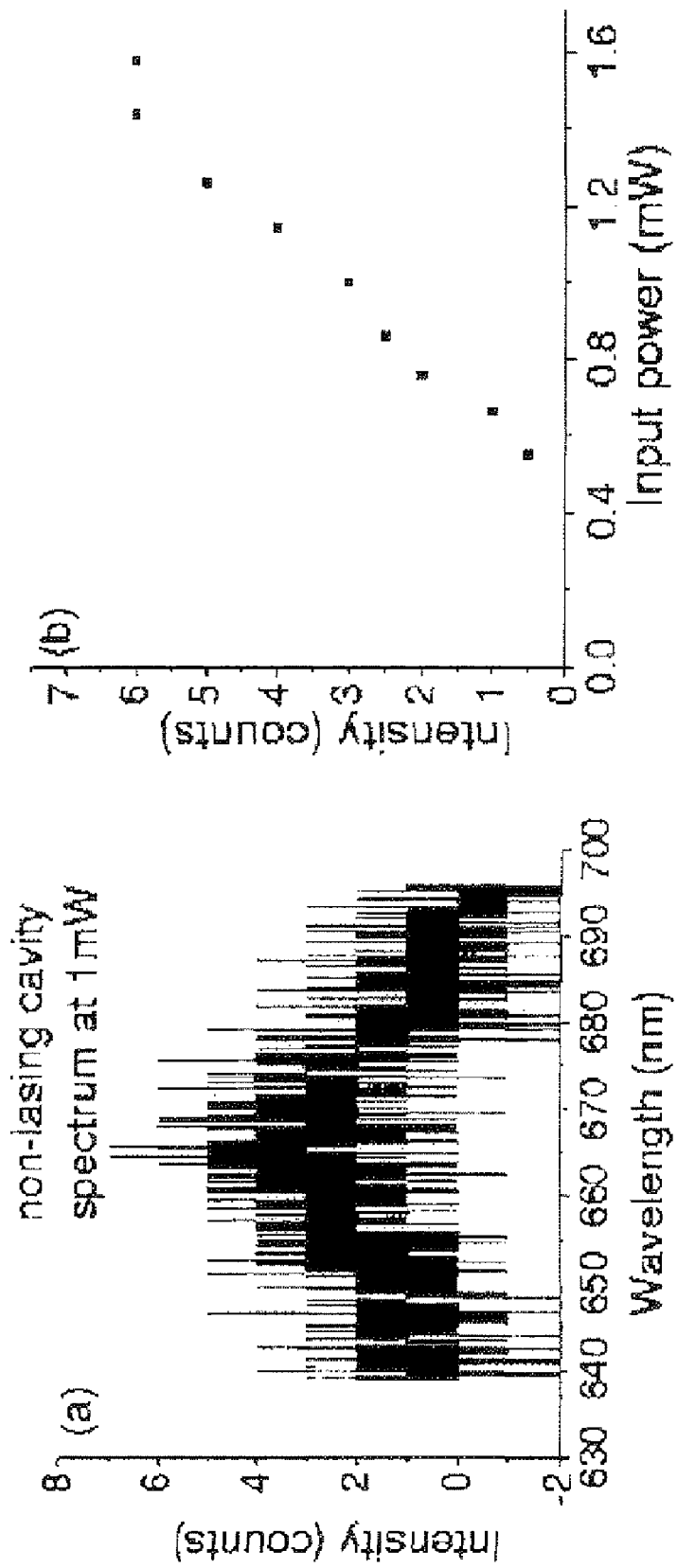
FIG. 9 shows a graph of a spectrum and a graph of a L-L cue of a typical nonlasing photonic crystal cavity.

The experimental results of optically pumped InGaP/InGaAlP to dimensional photonic crystal slab lasers of the example demonstrated that efficient and low-threshold lasing is possible in the InGaP/InGaAlP materials system, and that such materials and configurations are suitable to be configured as electrically pumped devices. For this work, we used a high Q cavity design (Y. Akahane, T. Asano, B. S. Song et al., "High-Q photonic nanocavity In a two-dimensional photonic crystal" Nature 425 (6961), 944-947 (2003)) consisting of a L3 linear defect within a triangular photonic crystal lattice of holes on a thin high-index slab. The L3 defect comprises an array of holes in a triangular (trigonal) or hexagonal pattern, in which the "defect" is the lack of a hole in three successive lattice locations in a linear configuration, as shown for example in FIG. 6. This design reduces the loss in the vertical direction by shifting the holes at the end of the defect area outwards. FIG. 6 shows the top view of a fabricated photonic crystal microcavity slab. The lattice spacing, a, the radius of hole, r, and the shift of the hole were defined, as shown in image (b) of FIG. 6. We lithographically controlled the ratio between the hole shift and the lattice spacing (shift/a) to be 0.2. Also, we lithographically varied the lattice spacing (a) within a range from 0.14 to 0.18 μm and the ratio between the hole radius and lattice spacing (r/a, the porosity factor) from 0.25 to 0.29. Fourteen periods of photonic crystal lattice (image (a) of FIG. 6) were used to surround the defect within the 170 nm thick quantum well active layer slab which has a refractive index of around 3.4 at 670 nm. The photonic crystal and cavity dimensions were designed to match the 670 nm emission wavelength of the InGaP active material. FIG. 7 shows luminescence spectra and the L (excitation power)-L (lasing peak intensity) curve from a device with lattice parameter a=170 nm and porosity factor r/a=0.26. The laser threshold was determined to be approximately 250 μW, and the linewidth was measured as 0.3 nm at threshold, yielding an effective Q of about 2000. Below threshold, only a broad background from the gain medium was measured from this cavity. Above 450 μW, heating of the laser cavity limited the output power and the L-L curve saturated. The two-dimensional (2D) photonic crystal cavity peak can be tuned by changing either the porosity or the lattice parameter of the photonic crystal lattice surrounding the nanocavity. FIG. 8 shows a laser with a slightly lower porosity (porosity factor r/a=0.25). For this laser, the measured laser threshold was 400 μW and the device again saturated as a result of cavity heating above 1 mW. Both cavities exhibited distinct threshold and linearity in the output power above threshold but before saturation. The lasing characteristic was very sensitive to the position of the excitation beam spot (~1 μm movement), which indicates that lasing occurs from a localized defect mode. Many of the photonic crystal cavity geometries that we defined did not result in demonstration of lasing, and we show a typical spectrum result from a nonlasing cavity in FIG. 9, along with the corresponding L-L curve. In this case, no inflection was measured and a more or less linear increase of emission with increasing excitation power was observed, saturating again at high excitation powers due to heating of the cavity. No lasing peak was observed, and the Fabry-Pérot filtered luminescence emission was not bright enough to observe with our experimental spectroscopic measurement setup.

Figure 10:
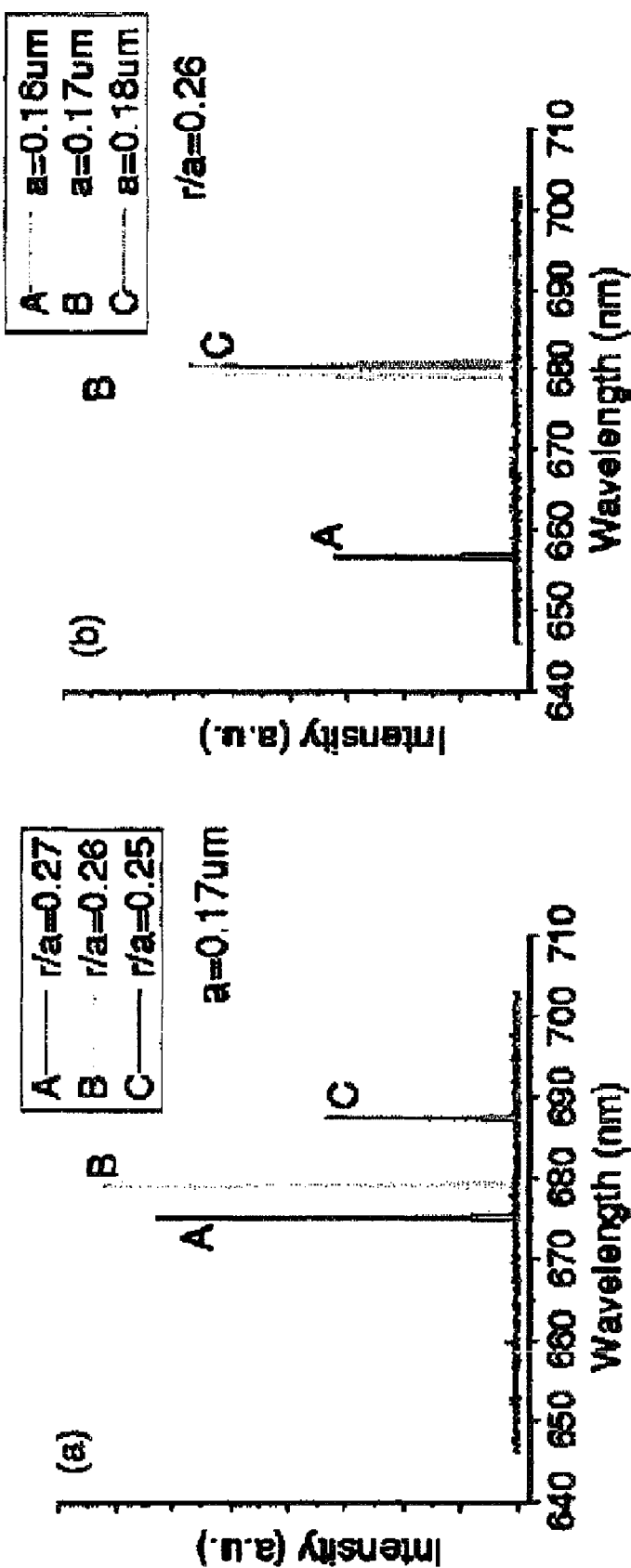
FIG. 10 shows spectra of lattice spacing fixed to 0.17 μm and r/a fixed to 0.26.

Graph (a) of FIG. 10 shows the influence of changing of the porosity on the laser emission wavelength, whereas graph (b) of FIG. 10 shows a similar tuning curve for changes in the photonic crystal lattice parameter. The uneven spectral shifts result from fabrication variation and device scaling only in two rather than three dimensions due to the fixed slab thickness. These data indicate that the InGaP photonic crystal lasers can be lithographically tuned throughout the gain emission of the quantum wells. The accuracy of such tuning is only limited by the quality and reproducibility of the fabrication process. It should be noted that the minimum feature size used for the successful definition of the photonic crystal mirror surrounding the laser cavities is approximately 80 nm, which is the distance between two adjacent holes in the slab. Compared to conventional InGaAsP material systems operating at 1550 nm, our fabrication process had to overcome the feature size scaling associated with the 2.3 times decreases in wavelength. Nevertheless, with our fabrication approach, it is possible to define dense arrays of laser cavities that are separated by as little as 2 μm. Compact multispectral sources can therefore be defined within the visible wavelength range.

APPLICATIONS AND USES: Visible photonic crystal lasers, especially those operating in the spectral vicinity of 670 nm, can enable a broad range of important applications. Applications include high density optical recording, high resolution visible laser projection displays, high speed optical sources for optical data communications systems as well as compact spectroscopic sources as ultrasmall sensors for biological and chemical detection within small sample volumes and other applications in spectroscopy. Visible photonic crystal lasers fabricated within thin membranes of InGaP/InGaAlP quantum well material and with ultra-small mode volumes ("nano-lasers" or "nanophotonic lasers") can exhibit low threshold powers and high switching frequencies. Photonic crystal lasers are suitable for use in chip scale optical networks where red lasers are ideally suited for low-cost optical interconnects through multimode plastic fibers. These nano-lasers can be efficient and compact multi-wavelength light sources with greater density and modulation speed than vertical cavity surface emitting lasers. Fast detectors for the light have already been developed in well-established silicon CMOS processes for sensitive receivers, and photonic crystal lasers can also provide optical solutions to the interconnect problems for next generation high-speed processors and aerospace platforms. For example, systems can be constructed in which identical photonic crystal arrays can serve both as compact multi-wavelength light sources as well as for multi-wavelength detectors to form wavelength division multiplexed communications systems.

The same photonic crystal devices, when operated in reverse bias, can also function as multispectral detector arrays, which can be used for polarization-sensitive detection in the visible and near-JR wavelength range. Moreover, these devices will be able to be assembled into complex systems that permit signal processing and optical logic functions before signal conversion from the optical into the electrical domain. Photonic crystal cavity volumes of below 0.01 μm³ can also be configured as dense polarization-sensitive hyperspectral detector arrays suitable for use with spectroscopic sources for sensors and can enable the switching speeds of these lasers to exceed 100 Gb/s.

In other embodiments, laser devices and detector devices that do not necessarily comprise photonic crystals can be fabricated using processes that introduce strain through crystal growth that is then relaxed by subsequent etching. Modification of electronic bandgap in the laser or detector medium by adjusting strain is a very powerful way to change the bandgap of the emitting material. For example, at small sizes such as described in this writing, one can provide tremendously large strain gradients. Typically it is possible to include 1-3% strain during growth and this can all be relaxed within 10 nm from the surface, preventing surface recombination and rendering the relaxed region transparent to the light generated in the optical cavity. Strain confinement has been known for some time. See Kash K; Bhat R; Mahoney D D; Lin P S D; Scherer A; Worlock J M; Van der Gaag B P; Koza M; Grabbe P., "Strain-induced confinement of carriers to quantum wires and dots within an InGaAs—InP quantum well", APPLIED PHYSICS LETTERS 1989, vol 55, iss 7, pp 681-683. However, strain confinement has not been used for bandgap engineering since the strain gradients at the longer length-scales are typically very small and are overshadowed by other effects. Here, we deal with much smaller length-scales, partly because we go to shorter wavelengths.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

AUGER AND SURFACE RECOMBINATION LOSSES: The two most important limitations of photonic crystal lasers have been (i) the large surface to volume ratios, leading to surface recombination problems in many materials systems, as well as (ii) the re-absorption of light emitted by the optical cavity within the photonic crystal mirrors surrounding the cavity. These limitations are directly related to the great advantages and the simplicity of fabrication of photonic crystal lasers, which can be lithographically defined within thin slabs of active material without the need for complex external mirror definition or growth. This lithographic fabrication approach has been shown to be very powerful in enabling dense arrays of multi-spectral sources and eventually will enable the lithographic alignment of lasers in large interconnected systems. However, the re-absorption of light within the mirrors implies that the mirrors as well as the cavity have to be rendered transparent before lasing can occur and the surface recombination velocities have limited the materials systems within which efficient photonic crystal lasers can be defined. As a result, most photonic crystal lasers with high refractive index contrast and small mode volumes described in the literature so far have been limited to the InGaAsP/InP materials system, which exhibits relatively low surface recombination losses.

Another technological benefit of defining lasers that emit at longer-wavelengths has been that the lithographic resolution is relaxed and nanoscale imperfections can be tolerated. However. InGaAsP/InP materials are known to suffer from serious Auger recombination losses, which increase with the carrier density. The problem with this particular loss mechanism is that when laser cavities are miniaturized, the current density during laser operation becomes very large, accompanied by substantial cavity heating and the combination of these two effects leads to even larger Auger losses. This problem has been identified and studied for other laser geometries, such as vertical cavity surface emitting lasers, and has contributed to the relatively slow adoption of InGaAsP/InP microcavity lasers.

Auger recombination is a process in which recombination of an electron and a hole occur without electromagnetic radiation being emitted, and the excess energy and momentum of the recombining electron and hole are given up to another electron or hole. The Auger recombination is therefore dependent on the third power of the concentration of charge carriers in a material. Auger loss can be related to a material parameter Ca, the Auger coefficient. For $In_xGa_{1-x}As$ in $In_xGa_{1-x}As$/InGaAsP/InP strained multiple quantum well lasers operating at nominally room temperature, Auger coefficients of $5\pm1\times10^{-30}$ $cm^6$ $seconds^{-1}$, $7\pm1\times10^{-30}$ $cm^6$ $seconds^{-1}$, and $13\pm1\times10^{-30}$ $cm^6$ $seconds^{-1}$ were measured for x=0.53, x=0.63 and x=0.73, respectively, as reported by Davis et al. (IEEE Photonic Technology Letters. Vol. 5, No. 2, February 1993, pp. 120-1.22). For pseudomorphic layers containing 20% excess indium, an Auger coefficient of $1.3\times10^{-29}$ $cm^6$ $seconds^{-1}$ was measured.

As a solution, we propose to use a different materials system that does not suffer from these excessive Auger losses, while still offering relatively low surface recombination velocities. The InGaP/AlInGaP materials system, lattice matched to GaAs, is widely used in visible light emitting diodes and lasers (such as traffic lights and laser-pointers). It can easily be grown and microfabricated by high-resolution lithography and anisotropic etching to define photonic crystal laser cavities, and offers excellent quantum efficiencies along with well-known doping and contacting procedures.

Figure 11:
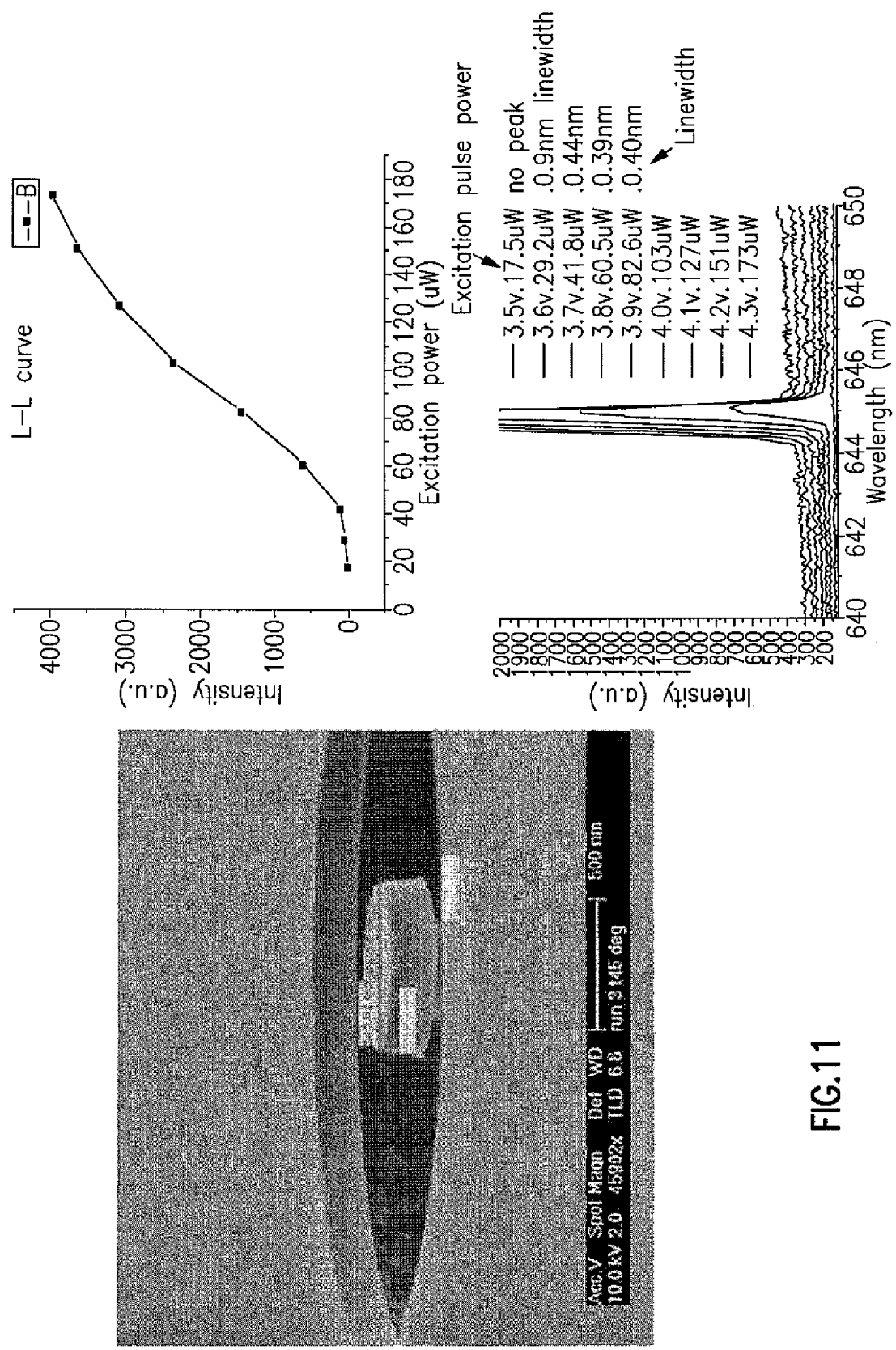
FIG. 11 shows an exemplary micro-disk laser fabricated in InGaP and a graph of a corresponding L-L curve and spectra for various excitation powers.

We have recently demonstrated that surface recombination does not present a significant problem in this materials system by defining the smallest disk lasers as shown in FIG. 11, with diameters as small as 600 nm. FIG. 11 shows an exemplary micro-disk laser fabricated in InGaP slabs with 600 nm diameter and resonance Q of 2000 and corresponding graphs of threshold L-L curve and spectra of laser emission using different pump powers that shows a spectral narrowing of the laser peak. The low thresholds of these lasers clearly indicates that InGaP quantum wells are ideally suited for the definition of ultra-compact and efficient light sources that do not suffer from cavity heating problems.

Figure 12:
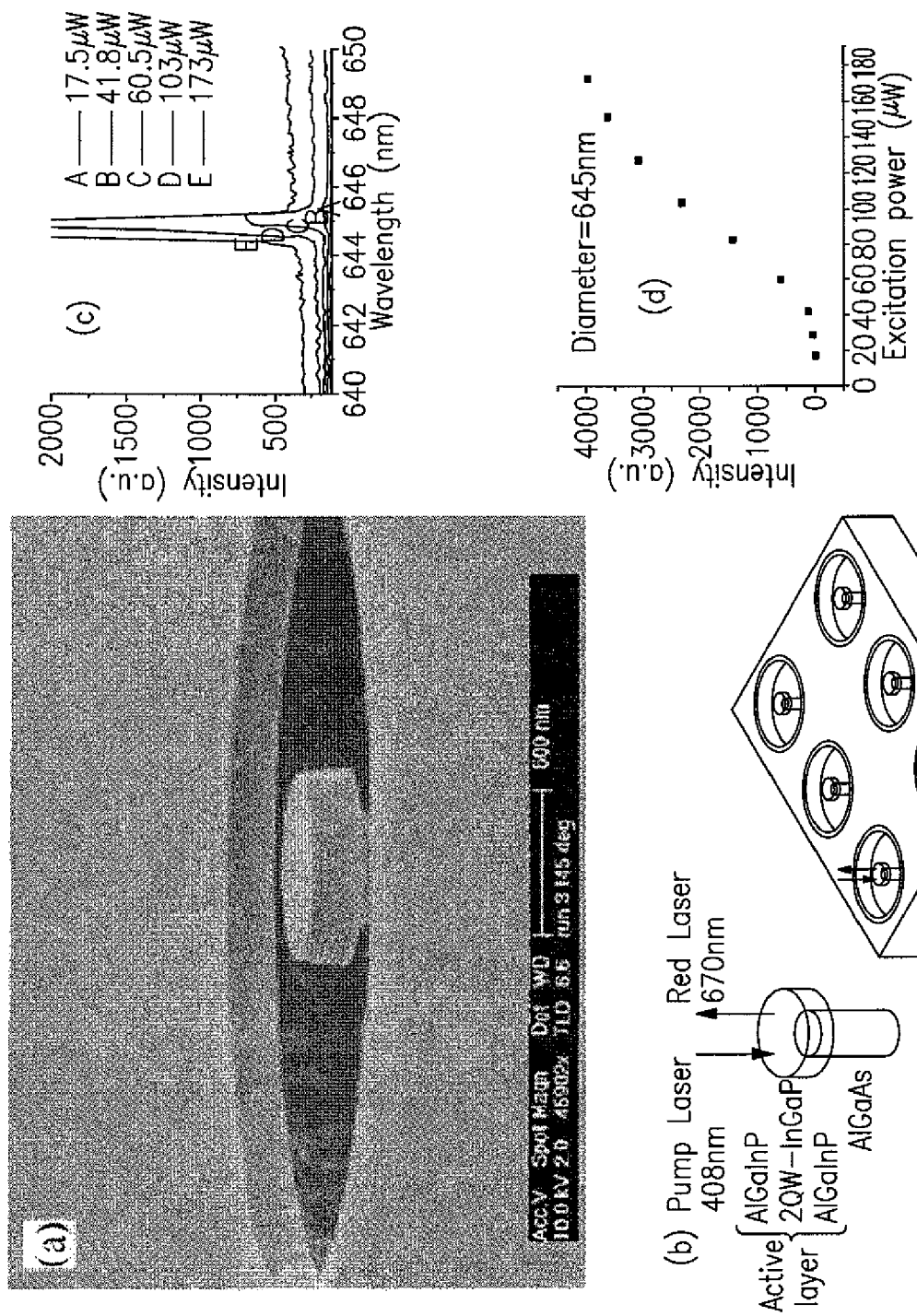
FIG. 12 shows another embodiment of an exemplary micro-disk laser fabricated in InGaP, including an exemplary laser array, and a graph of a corresponding L-L curve and spectra for various excitation powers.

FIG. 12 shows a scanning electron microscope image with corresponding spectra an L-L curve of another embodiment of a 645 nm diameter submicron microdisk laser structure. By defining a post radius to 0.2 μm smaller than that of the microdisk we minimize the light leakage through the post while maintaining acceptable heat sinking of the active laser mode volume. We have fabricated and characterized many different sizes of disks, with diameters ranging from 1.6 μm down to 0.5 μm, by deliberately decreasing the diameter in 100 nm steps. In these laser arrays, we observe lasing in all of the disks except for the 0.5 μm diameter devices. The microdisks were optically pumped at room temperature using 8 ns pulses separated by 30 μs periods (0.027% duty cycle) with a 408 nm InGaN semiconductor diode laser. The pump beam was focused onto the sample surfaces vertically coupling the excitation light (FIG. 12 (b)) through a 50× objective lens to form a pump beam spot size less than 3 μm in diameter. Free space pumping does not require fine alignment of the optical fiber to the disk, an advantage especially for the submicron disk sizes described here. Moreover, free space pumping covers the entire disk area and renders the cavity and the central part of the laser disk transparent to minimize reabsorption in the central disk position. However, the pumping and collection of laser emission from the disk are not very efficient. The excitation powers used in this letter were determined by dividing the reading of power meter at the sample (averaged laser pulse power) by the duty cycle. The emission from the lasers was then collected through the same objective lens, and lasing spectra were taken with a liquid nitrogen cooled charge coupled device (CCD) (Spec10) detector filtered by a monochromator (SpectraPro). The monochromator entrance slit width was set to a width of 10 μm and a 1200 g/mm grating was used, resulting in a spectral resolution of approximately 0.1 nm. An additional slip-up mirror was used to guide the light into a CCD imaging system to view images of laser cavity modes within the microdisks as well as the excitation pump spot. FIG. 12 (a) shows an angled view of a completely fabricated ultrasmall microdisk, taken in a scanning electron microscope. The sidewall roughness of the disk is less than 20 nm and the nonvertical sidewall is due to the nonoptimized dry etching recipe which could be further improved. FIG. 12 (b) illustrates the excitation and detection scheme used in this experiment, and it should be noted that this free space pump-collection measurement scheme is not efficient since a large portion of the excitation light does not couple into the mode. Indeed, much of the emitted light also escapes horizontally along the disk plane and vertically into the GaAs substrate. We expect that much higher output power and lower thresholds can be observed when using fibercoupling measurements. FIG. 12 graphs (c) and (d) show the corresponding luminescence spectra and an L (excitation power)-L (lasing peak intensity) curve from a device with disk diameter of 645 nm and post diameter of 200 nm. The laser threshold was measured to be approximately 50 μW. This threshold power is similar to that of photonic crystal slab lasers that we recently fabricated within the same InGaP material system. The linewidth was measured as 0.4 nm at threshold, yielding an effective Q of about 1600. Above 120 μW, heating of the laser cavity ultimately limits the output power, and the L-L curve saturates.

Figure 13:
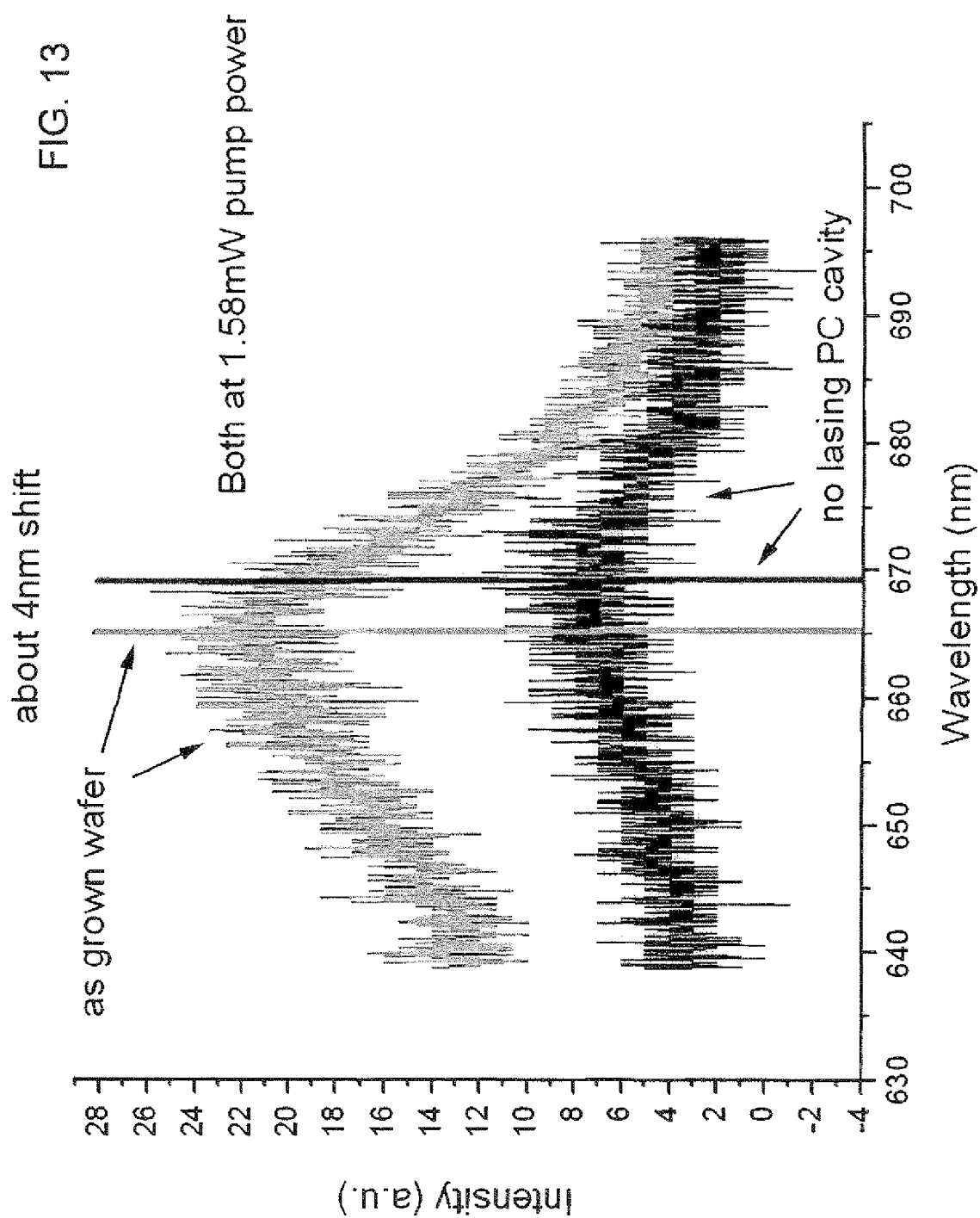
FIG. 13 shows a graph that illustrates a shift in the luminescence spectrum of InGaP quantum wells.

STRAIN CONFINEMENT: Another major advantage that the InGaP/InGaAlP materials system offers is the opportunity to introduce large amounts of strain into the light-emitting quantum well layers during the crystal growth procedure. In our laser designs, we use this strain for the purpose of reducing surface recombination and solving the problem of light re-absorption within the mirrors surrounding photonic crystal laser cavities. Strain confinement, or the shift of the bandedge due to mechanical strain resulting from the application of pressure is a well-known phenomenon, which has been used in the past to define waveguides in III-V semiconductor devices. Typically, strain is locally applied through the use of deposited "stressors" and relatively weak confinement is experienced by carriers as the strain relaxation occurs over large (micron-scale) distances. Densely nano-patterned materials, such as photonic crystals, however, provide us with the opportunity to reduce the distances over which strain relaxation occurs to much shorter length-scales. Any strain is completely relaxed at the etched surfaces, whereas the high strain introduced during crystal growth is still present in the quantum wells at some distance from these surfaces. As typical etched feature sizes approach 100 nm, the strain gradient becomes significant, leading also to the opportunity of sizeable bandgap variations with distance from the surfaces. If properly engineered, this can lead to the confinement of carriers away from the exposed surfaces, and corresponding reduction in the losses and threshold currents of lasers. Moreover, if the bandgap of the semiconductor is designed to shift to larger values when the strain is relaxed, it is possible to define "self-aligned" optical cavities in which the strain is still present within the cavity (where the distance to surfaces are larger) is greater than within the mirror (where the distance to the surface is very short) regions, rendering the mirrors transparent to the light emitted within the cavity. We have seen this effect already in our present weakly strained InGaP quantum wells, where a 4 nm wavelength shift to shorter wavelengths is observed within the microfabricated structures. For example. FIG. 13 shows a graph of a shift in the luminescence spectrum of InGaP quantum wells due to the relaxation of the built-in strain and that much larger (>10 nm) shifts are expected when the InGaP quantum wells are intentionally strained. Unfortunately this result in grown hetero structures that were not deliberately strained, but inadvertently included compressive strain in the quantum well, is in the opposite direction from the desired strain required for our purposes, as compressive strain results in blue shifting the bandgap whereas tensile strain results in the desired red shift of the quantum well emission. We believe that, with the correct tensile strain in the quantum wells, red shifts of over 10 nm will be possible, leading to the opportunity of deliberately relaxing that strain within the mirror regions that naturally are more porous than the laser cavity.

While the present invention has been particularly shown and described with reference to the structure and methods disclosed herein and as illustrated in the drawings, it is not confined to the details set forth and this invention is intended to cover any modifications and changes as may come within the scope and spirit of the following claims.

What is claimed is:

1. A photonic crystal laser comprising:
   a photonic crystal slab laser cavity comprising crystalline layers in which an internal strain of at least one of a plurality of quantum wells is relaxed at one or more surfaces, retaining a higher strain at a plurality of quantum wells at a distance from said one or more surfaces;
   a photonic crystal mirror situated adjacent to said photonic crystal slab laser cavity; and
   electrical pads configured to receive an electrical signal, said electrical pads attached to said photonic crystal slab laser cavity via an insulating layer, said photonic crystal laser configured to emit a laser light in response to said electrical signal.

2. The photonic crystal laser of claim 1, wherein said photonic crystal slab laser cavity comprises InGaP/InGaAlP.

3. The photonic crystal laser of claim 1, wherein said one or more surfaces comprise at least one etched surface.

4. The photonic crystal laser of claim 1, wherein said photonic crystal laser is configured to emit laser light in the visible spectrum.

5. The photonic crystal laser of claim 1, wherein said photonic crystal laser is configured to emit laser light in a range of wavelength of between 500 nm and 700 nm.

6. The photonic crystal laser of claim 1, wherein said photonic crystal laser is configured to emit laser light in a range of wavelength of between 650 nm and 690 nm.

7. The photonic crystal laser of claim 1, wherein said insulating layer comprises AlGaAs.

8. The photonic crystal laser of claim 1, wherein said electrical pads comprise a lateral contact geometry.

9. A plurality of photonic crystal lasers according to claim 1, said plurality of photonic crystal lasers situated on a common substrate and configured as a multi-wavelength emitter array by lithographic tuning, wherein at least one of said plurality of photonic crystal lasers emits laser light at a first wavelength and at least another one of said plurality of photonic crystal lasers emits a laser light at a second wavelength, and said first and said second wavelengths are set during fabrication of said plurality of photonic crystal lasers.

10. A plurality of photonic crystal lasers according to claim 9, wherein said photonic crystal lasers are configured to be used in a wavelength division multiplexed system.

11. A plurality of photonic crystal lasers according to claim 9, wherein said photonic crystal lasers are configured as ultra small lasers to be used in biological or chemical detection within small sample volumes.

12. A plurality of photonic crystal lasers according to claim 9, wherein said photonic crystal lasers are configured as ultra small lasers to be used in spectroscopy applications.

13. A photonic crystal detector comprising:
   a photonic crystal slab cavity comprising InGaP/InGaAlP crystalline layers, said InGaP/InGaAlP crystalline layers having a relaxed strain at one or more etched surfaces and a higher strain at a plurality of quantum wells and at a distance from said one or more etched surfaces;

a photonic crystal mirror situated adjacent to said photonic crystal slab cavity; and electrical pads configured to generate an electrical signal in response to light incident on said photonic crystal detector, said electrical signal indicative of a property of said light incident on said photonic crystal detector.

14. The photonic crystal detector of claim 13, wherein said photonic crystal detector is configured to detect light in the visible spectrum.

15. The photonic crystal detector of claim 13, wherein said photonic crystal detector is configured to detect light in a range of wavelength of about 500 nm to 700 nm.

16. The photonic crystal detector of claim 13, wherein said photonic crystal detector is configured to detect light in a range of wavelength of about 650 nm to 690 nm.

17. A plurality of photonic crystal detectors according to claim 13, said plurality of photonic crystal detectors situated on a common substrate and configured as a multi-wavelength detector array by lithographic tuning, wherein at least one of said plurality of photonic crystal detectors detects light at a first wavelength and at least another one of said plurality of photonic crystal detectors detects light at a second wavelength, and said first and said second wavelengths are set during fabrication of said plurality of photonic crystal detectors.

18. A plurality of photonic crystal detectors according to claim 17, wherein said photonic crystal detectors are configured to be used in a wavelength division multiplexed system.

19. A plurality of photonic crystal detectors according to claim 17, wherein said photonic crystal detectors are configured as ultra small detectors to be used in biological or chemical detection within small sample volumes.

20. A plurality of photonic crystal detectors according to claim 17, wherein said photonic crystal detectors are configured as ultra small detectors to be used in spectroscopy applications.

* * * * *